(12) United States Patent  (10) Patent No.: US 7,775,833 B1
Le et al.  (45) Date of Patent: Aug. 17, 2010

(54) HIGH SPEED INTELLIGENT CABLE

(75) Inventors: Kevin D. Le, Richland Hills, TX (US);
Ricardo Ramirez, Fort Worth, TX (US);
Kisoo Jung, Irving, TX (US)

(73) Assignee: Williams Pyro, Inc., Fort Worth, TX (US)

( * ) Notice: Subject to any disclaimer, the term of this patent is extended or adjusted under 35 U.S.C. 154(b) by 244 days.

(21) Appl. No.: 12/163,507

(22) Filed: Jun. 27, 2008

(51) Int. Cl.
*H01R 13/713* (2006.01)
(52) U.S. Cl. .................................. 439/620.08
(58) Field of Classification Search ............. 439/620.08
See application file for complete search history.

(56) References Cited

U.S. PATENT DOCUMENTS

| | | | |
|---|---|---|---|
| 4,508,399 A * | 4/1985 | Dowling et al. | 439/67 |
| 4,853,626 A * | 8/1989 | Resler | 324/754 |
| 5,470,238 A * | 11/1995 | Walden | 439/98 |
| 5,571,994 A * | 11/1996 | Norton | 174/652 |
| 7,477,159 B2 * | 1/2009 | Wang et al. | 340/815.83 |

\* cited by examiner

*Primary Examiner*—Truc T Nguyen
(74) *Attorney, Agent, or Firm*—Amelia F. Morani

(57) ABSTRACT

The high speed intelligent cable provided herein is multifunctional, lightweight, flexible and re-configurable. The cable assembly includes a low profile ribbon cable of multiple conductors. Built-in health indicators provide user assessment of, for example, connectivity. Active electronics and embedded intelligent firmware provide various functions, to include built-in test performance capability. Ready cable reconfiguration for system integration, or for other needs, is facilitated by logic and switching circuitry. Still further, built-in automatic multi-functional cable testing may include automatic reconfiguration. Testing and reconfiguration can be remotely activated. The cable described herein can reduce time and manhours needed for testing, installation, and maintenance. The lightweight multi-functional cable makes a positive contribution to the function/mass payload ratio in complex and mass-sensitive applications.

20 Claims, 5 Drawing Sheets

HIGH SPEED INTELLIGENT CABLE

STATEMENT REGARDING FEDERALLY SPONSORED RESEARCH OR DEVELOPMENT

This invention was made with government support under Contract No. HQ0006-06-C-7480 between the Missile Defense Agency section of the U.S. Department of Defense and Williams-Pyro, Inc. The government has certain rights in the invention.

BACKGROUND OF THE INVENTION

The present invention relates generally to lightweight flexible cabling. More particularly, the present invention relates to multi-functional, high speed intelligent cables.

Transferring signals via cables or wires remains a preferred and a reliable mode for many applications, despite the advent of wireless means for transferring signals. Generally, cables are made of electrically conducting materials such as copper, aluminum, etc. and are shielded by an insulating material such as rubber or plastic for protection and safe handling. Cables that are used in high-end sophisticated systems such as satellite electronic harness systems may need to have, and may be required to have, capability to withstand extreme conditions such as high temperature and electromagnetic interference (EMI).

Conventional satellite electronic harness configurations utilize heavy and cumbersome cabling. These types of cables require heavy brackets to properly install, and consume a significant portion of the satellite's payload budget. Applications, other than satellites, can have similar volume and mass considerations. Marine equipment, unmanned spacecraft, and even commercial passenger aircraft can have a need for lightweight flexible cabling.

Flexible cabling can conform to the walls of a structure for mounting. Flexible cabling can easily bend into curvaceous paths. Less stress is induced on flexible lightweight cabling that bends as compared to conventional cabling, yielding increased life for a flexible cable that is mounted in a bent configuration. Flat cables can provide connection with low vertical clearance.

Conventional cabling may not afford self-diagnostic identification of a non-conducting line. Conventional cables may not facilitate system level integration and do not have test and diagnostic capability.

The components associated with conventional cabling, such as that for a satellite, compose a significant portion of the vehicle mass. Conventional cabling is labor intensive with respect to, for example, manufacturing. Further, conventional cabling systems are difficult to install in a vehicle and require bulky support brackets and terminations. In view of these characteristics, it is easy to see that a microscopically small flat and flexible cable could greatly reduce, for example, satellite weight. Other applications could also benefit from a reduction in the weight and volume of electronic system components, while maintaining or even improving system reliability. A flat flexible cable could be mounted within the walls of a structure.

System integration is not conventionally facilitated by the cables themselves. Bulky black boxes are conventionally used at interconnect and integration points. Cable installation and diagnostics and performance tests on installed cables or pre-installed cables can be labor intensive and time consuming.

SUMMARY OF THE INVENTION

The present invention provides a multi-functional high speed intelligent cable that may ultimately replace bulky black boxes and cables with a lightweight system that can be mounted on the structural wall of the vehicle.

One aspect of the present invention is a flexible high speed connection, which can readily conform to bends and curves resulting in low stress induced by a curved mounting configuration and ease of installation due to the flexibility of the cable, a multi-flex ribbon cable. A multi-functional cable assembly comprising a multi-flex cable in accordance with the present invention may have reduced cable fatigue from, in part, its flexibility and/or its low weight.

Another aspect of the present invention is the low vertical profile which provides low clearance and installation in space restricted environments.

Another aspect of the present invention is the resulting low mass for an increased functionality, positively contributing to the mass fraction payload ratio of, for example, a satellite vehicle.

Another aspect of the present invention is that it comprises built-in health indicators for ready assessment of, for example, connectivity.

Yet another aspect of the present invention is active electronics and embedded intelligent firmware.

Yet another aspect of the present invention is built-in test performance capability.

Still another aspect of the present invention is easy reconfiguration of the cable for system integration, or for other needs. Still further, built-in automatic multi-functional cable testing may also include automatic reconfiguration.

A cable in accordance with an exemplary embodiment of the present invention may require less touch labor and reduced time and labor for maintenance testing and scheduled, or otherwise desired, reconfigurations.

Another aspect of the present invention may be the ease of manufacturing. For example, slap-shielding is used for electromagnetic interference shielding of the entire cable as opposed to a conventional shielding of individual lines. The benefits of this aspect of the present invention are even greater as compared to micro-shielded cables.

Embodiments of the present invention may employ a unique built-in test capability. With integrated circuits and advanced software algorithms, a cable assembly in accordance with the present invention can check all the conductors in the flex cable for discontinuity or damage, and may reconfigure itself when activated by software and/or hardware. Further, in some embodiments, a satellite communication channel can be used to remotely activate a cable test and reconfiguration of a cable installed in a satellite from earth.

BRIEF DESCRIPTION OF THE FIGURES

The detailed description is presented with reference to the accompanying figures. Like numbers across drawings may reference like features and components, but may vary across embodiments. For more complete understanding of the features and advantages of the present invention, reference is now made to the detailed description of the invention along with the accompanying figures, wherein.

DETAILED DESCRIPTION OF THE INVENTION

The invention, as defined by the claims, may be better understood by reference to the following detailed description. The description is meant to be read with reference to the figures contained herein. This detailed description relates to examples of the claimed subject matter for illustrative purposes, and is in no way meant to limit the scope of the invention. The specific aspects and embodiments discussed herein are merely illustrative of ways to make and use the invention, and do not limit the scope of the invention.

An exemplary feature of a multi-functional multi-flex cable in accordance with an embodiment of the present invention is automatic built-in testing and reconfiguration with health indicators, which may significantly reduce touch labor and time for cable checkout during satellite integration. Health, or integrity status indicators may be, for example, light emitting diodes (LEDs). If degraded signal lines are found, the cable can reconfigure for desired performance. Further, in some embodiments, the cable test and reconfiguration can be remotely activated. For example, remote testing and reconfiguration can be between earth via the satellite communication channel to a satellite during an ongoing satellite mission.

More particularly, logic circuitries can enable automatic built-in test and reconfiguration of the multi-flex cables. If degraded signal lines are found during testing, the defective cable may be automatically re-configured. This can significantly reduce labor and time for cable checkout during sensitive operations, such as satellite integration. The cable's logic circuitries can be remotely activated from earth via satellite communication channel during a satellite mission. In yet another embodiment, testing results may be provided to a user for subsequent additional reconfiguration, initial configuration input, or for user-directed reconfiguration.

FIGS. 1 to 4 illustrate various system and block diagrams for describing a self-managing cable assembly, in accordance with exemplary embodiments of the present invention. The order in which the blocks of the system are described is not intended to be construed as a limitation, and any number of the described system blocks can be combined in any order to implement the system, or an alternate system. Additionally, individual blocks may be deleted from the system without departing from the spirit and scope of the subject matter described herein. Furthermore, the system can be implemented in any suitable hardware, software, firmware, or a combination thereof, without departing from the scope of the invention.

Figure 1:
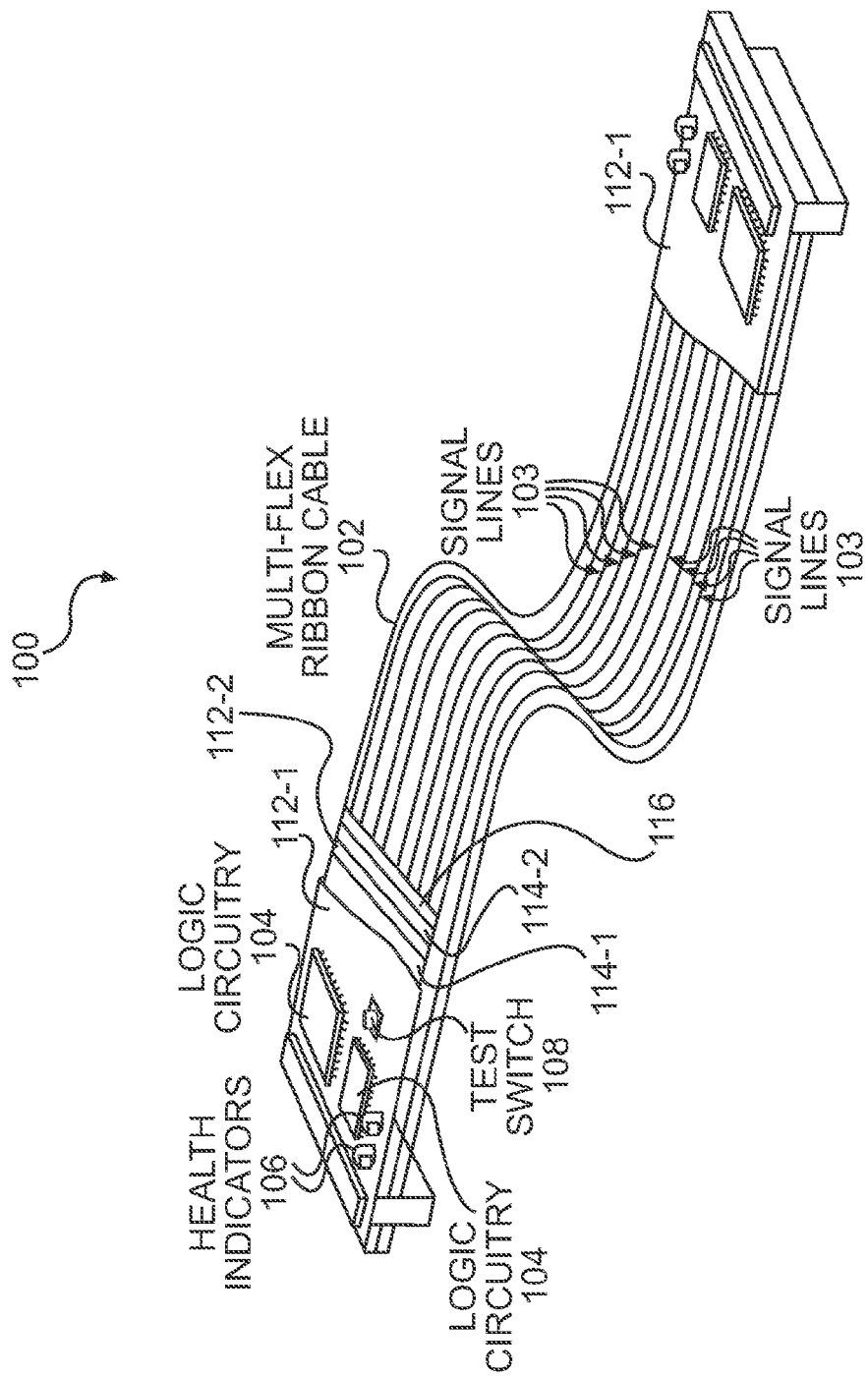
FIG. 1 illustrates a perspective view of an exemplary multi-functional high speed intelligent cable assembly comprising a multi-flex ribbon cable and logic circuitries.

FIG. 1 illustrates an exemplary multi-functional cable assembly 100 having a multi-flex cable 102 and logic circuitries 104. In one implementation, the cable assembly 100 includes a multi-flex ribbon cable 102, referred to as cable 102 hereinafter. The cable 102 is a cable with several conducting wires or signal lines 103, placed parallel to each other on the same flat plane. The signal lines 103 include EMI shielded micro-interconnects for high-speed data transmission and low noise operation. The cable 102 is lightweight, flat and flexible enough to be smoothly integrated with curvatures of structures such as space shuttles. Outer insulation layer 112-1 is shown cut away at either end. Two EMI shielding layers 114-1, 114-2 and a second insulation layer 112-2 are also shown cut away in layers. Part of inner insulation layer 116 is shown cut away, exposing embedded microconductors to include signal lines 103.

In one implementation, the cable assembly 100 also includes a logic circuitry 104 at both the ends of the cable 102. In another implementation, the logic circuitry 104 can be located at a remote end and can communicate with the cable 102 via a wired or wireless mechanism.

The logic circuitry 104 includes active electronics and embedded firmware for managing the cable 102. The logic circuitry 104 tests for and diagnoses faults that may occur in the cable 102. Further, the logic circuitry 104 may re-configure the cable 102 automatically when activated by a software or hardware to render the cable 102 free of faults and thus ensure smooth transmission of signals. In certain applications, such as space applications, the software or hardware can be remotely activated, such as from earth, via a satellite communication channel.

The logic circuitry 104 forms a part of a circuitry that includes one or more health indicators 106 and a test switch 108. The health indicators 106 may be visual means that give information about the health status of the cable 100. In one implementation, the health indicators 106 can be in the form of LEDs that indicate the health status or operating condition of the cable 102 by, for example, different colors. The health indicators 106 indicate, for example, whether the cable 102 is healthy, reparable, or irreparable. The test switch 108 is a switch that can be pushed for initiating a test procedure for the cable 102. While the multi-functional cable of FIG. 1 is shown with a single test switch 108, alternate embodiments may comprise more than one test switch.

Figure 2:
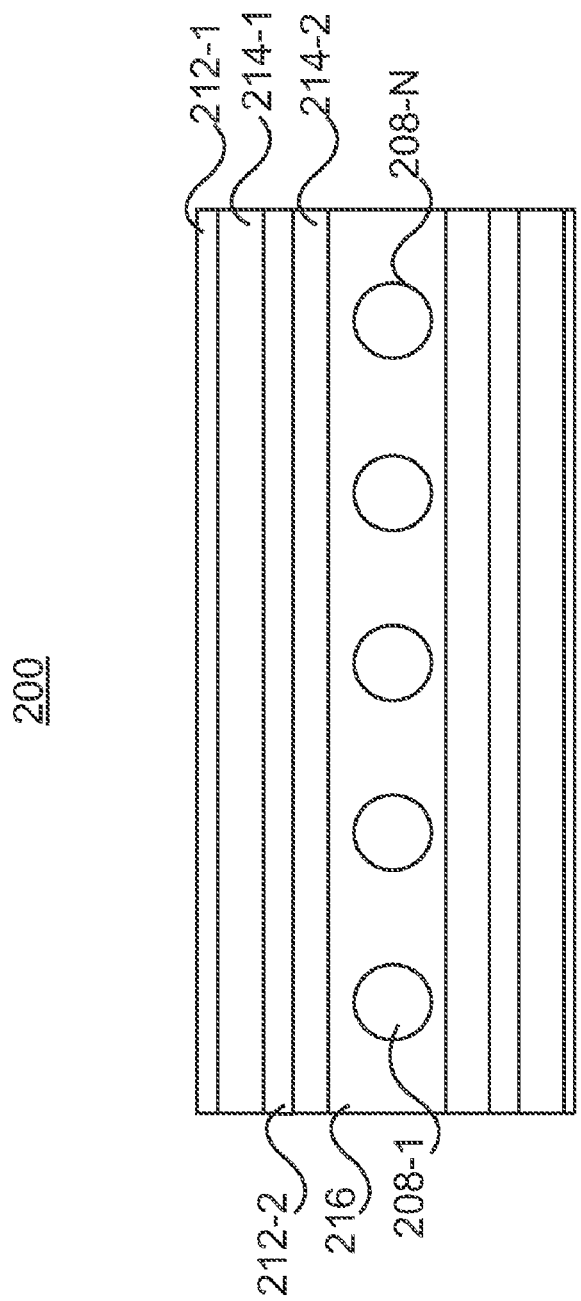
FIG. 2 illustrates an exemplary cross-sectional structure of a multi-flex ribbon cable.

FIG. 2 illustrates an exemplary structure of a multi-flex ribbon cable. In one implementation, the cable 102 with multiple conductors is EMI-shielded using a slap-shielding technique, resulting in a high-density interconnect that allows for high-speed data communication. Implementing slap EMI shielding in the cable 102 can eliminate complicated and expensive coating processes associated with fabricating individually EMI-shielded cables, especially with respect to micro-shielded cables. Snap-in connectors on flat cables 102, not shown in FIG. 2, can simplify connector installations, and may require no special skill or handling.

A cross-section of a segment 200 of the cable 102 is shown in FIG. 2. As represented in the segment 200, the cable 102 includes multiple conductors 208-N sandwiched between several layers of insulation for, in part, protecting the conductors. The outer or topmost insulation layer 212-1 provides strength and structure to the cable 102, and can be made of any insulating material with high resistivity, such as plastic or rubber. The next layer is a metallic EMI shielding layer 214-1. In one implementation, the EMI shielding layer 214-1 may be made of copper.

After the EMI shielding layer 214-1, there is a second insulation layer 212-2, similar to the insulation layer 212-1. Another EMI shielding layer 214-2, similar to the EMI shielding layer 214-1, is provided after the insulation layer 212-2. Next in the row is an inner insulation layer 216 that embeds several micro-conductors 208-1 to 208-N, collectively referred to as micro-conductors 208, which comprise signal lines 103.

In one implementation, the inner insulation layer 216 can be made of a thermosetting polyimide material such as Kapton polyimide film (Dupont Corporation, Wilmington, Del., USA). In one embodiment, the micro-conductors 208 can have a diameter of about 120 micrometers and can be made of materials with high electrical conductivity such as copper. The total thickness of the cable 102 can be around 350 micrometers, with the EMI shielding layers 214-1 and 214-2 having a thickness of approximately 50 microns each.

It is to be noted that a cable 102, in accordance with embodiments of the present invention, has low volume and mass, and is flat and flexible to conform easily to structural curvatures of the system in which the cable 102 is installed. A cable 102 can be made using simple fabrication techniques contributing to low cable costs. Moreover, EMI shielding and multiple micro-conductors may provide a higher speed of data transmission through the cable 102.

Figure 3:
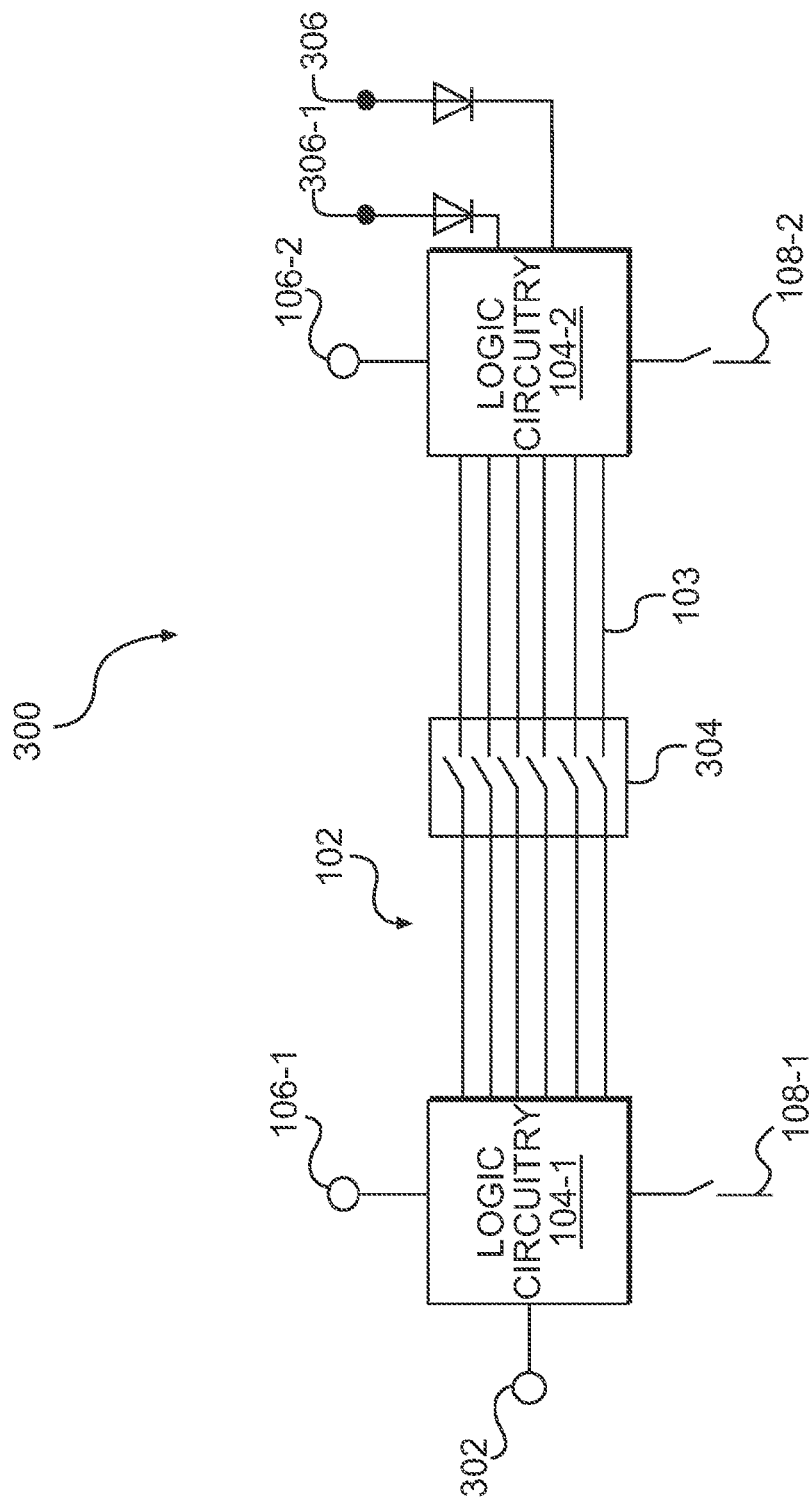
FIG. 3 illustrates an exemplary block diagram depicting an exemplary cable assembly with switch mechanism.

FIG. 3 illustrates an exemplary block diagram 300 of the cable assembly 100. In one implementation, the cable assembly 100 includes the cable 102 along with the logic circuitries 104-1 and 104-2 on both ends of the cable 102. A signal generator 302 provides an input signal to the cable assembly. In one implementation, the logic circuitries 104 can be implemented by complex programmable logic devices (CPLD). CPLD offers easy and inexpensive internal functionality updates and remote configuration. Additionally, CPLD does not require external memory to keep the firmware used for configuration.

A CPLD may include a connector for an external power supply of 5 VDC. However, the CPLD also has the ability to obtain its operational power straight from data lines. In order to program a CPLD used in accordance with exemplary embodiments of the present invention, IEEE 1532 and the IEEE 1149.1 standards can be used in the respective logic circuitries 104. A 133 MHz oscillator can serve as a clock for the logic circuitries 104. In alternate embodiments, alternate clock sources may be incorporated. The voltage regulator used in the logic circuitries 104 can be an ultra low-dropout (LDO) regulator.

The logic circuitries 104-1 and 104-2 form part of a circuitry that includes their respective health indicators 106-1 and 106-2, and test switches 108-1 and 108-2. The circuitry also includes an interconnect switching circuitry 304, which is placed in the path of the cable 102 between the logic circuitries 104-1 and 104-2

The interconnect switching circuitry 304 allows self-testing and re-configuration in case of a fault or damage on any signal line 103 or micro-conductor of the cable 102. The interconnect switching circuitry 304 can switch a faulty line with a spare line and thus ensures smooth transmission of data through the cable 102. At the terminating end of the cable assembly, such as after the logic circuitry 104-2, the signal on the cable 102 is transmitted across a load with supply voltages 306-1 and 306.

In one implementation, for testing purpose, for example, the logic circuitries 104-1 and 104-2 in the cable assembly are configured as master and slave nodes. Either of the two logic circuitries 104 can serve as a master and the other end serves as a slave. The firmware for the testing can reside in either or both of the master and slave nodes.

Figure 4:
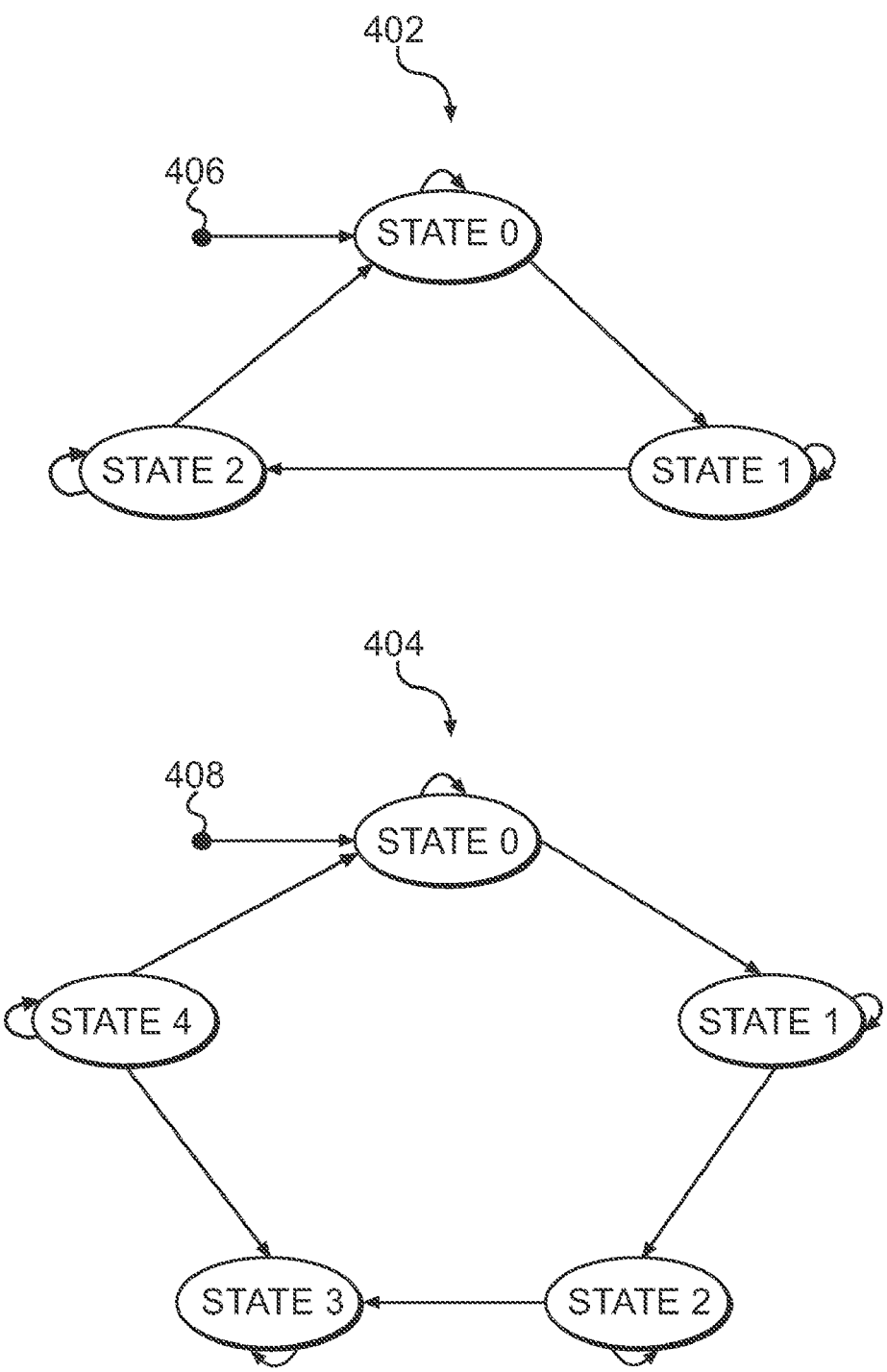
FIG. 4 illustrates exemplary finite state machine diagrams for operation at master and slave nodes of a cable assembly.

FIG. 4 illustrates finite state machine (FSM) diagrams for exemplary operation at master and slave nodes during testing phase, in accordance with an exemplary embodiment of the present invention. Diagram 402 shows a finite state machine at the master node, and diagram 404 shows a finite state machine at the slave node. These diagrams represent only one possible implementation, and it is to be understood that many variations are possible in this respect.

With reference to the diagram 402, the master remains in an initial state, i.e. state 0 unless the test switch 108-1 is pushed, thereby providing a test signal in high logic state to the hardware or firmware in the master node. Once the test is started, the master enters state 1. In state 1, the master instructs the slave to perform tests as per specified conditions. As soon as the slave recognizes the testing condition from the master, the master enters state 2. Until the test is completed, the master remains in the state 2. Once the slave completes the test, the slave intimates the master of the completion of the tests. On receiving the intimation, the master returns to state 0. A reset signal 406 can reset the master at anytime and force the master to return to state 0.

With reference to the diagram 404, the slave remains in an initial state, i.e. state 0 unless a test request is received from the master. On receiving a test request from the master, the slave enters state 1. In state 1, the slave recognizes a test condition communicated by the master and when it has recognized the test condition, it leaves state 1 and enters state 2. In state 2, the slave recognizes a pattern for a continuity test for checking a faulty signal line.

Thereafter, the slave enters state 3 where it performs the continuity test for all the signal lines 103 on the cable 102. After completing the continuity test, the slave enters state 4. In state 4, the slave intimates the master about broken or faulty signals lines and with this, the slave completes the test and returns to state 0. A reset signal 408 can reset the slave at anytime and force the slave to return to state 0.

Figure 5:
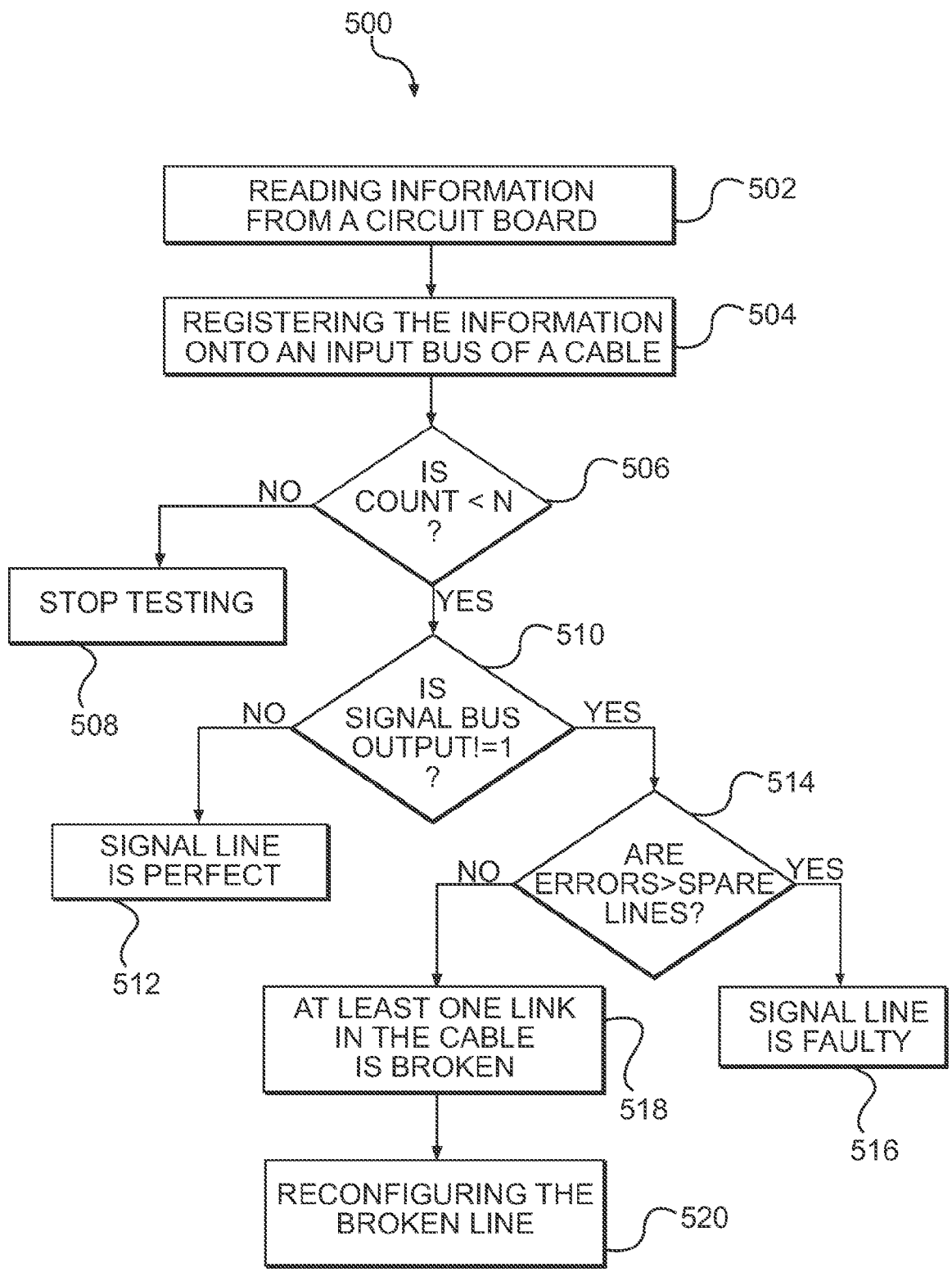
FIG. 5 illustrates an exemplary method for testing and monitoring of a signal line in a multi-functional high speed intelligent cable.

FIG. 5 illustrates an exemplary method for testing and re-configuring a multi-flex ribbon cable. The exemplary method is described, in part, above with reference to FIGS. 1 to 4. The order in which the method is described is not intended to be construed as a limitation, and any number of the described method blocks can be combined in any order to implement the methods, or alternate methods. Additionally, individual blocks may be deleted from the method without departing from the spirit and scope of the subject matter described herein.

At block 502, the information stored on a printed circuit board (PCB) of the cable assembly is read. In one implementation, the logic circuitry 104 reads information such as state of the test switch 108 and configuration status to identify a master node and a slave node.

At block 504, the information read from the PCB is registered or passed onto the input bus of the PCB. In one implementation, the information read by the logic circuitry 104 is provided to the input bus connecting the logic circuitry 104 to the cable 102.

At block 506, state of a counter is compared to the total number of signal lines (N) in the multi-flex cable. In one implementation, a counter is initialized to unit value and is incremented after testing of a signal line 103 is completed.

At block 508, the value of the counter is compared with the total number of signal lines (N) 103 in the cable 102. If the value of the counter is found to be greater than N, then further testing is stopped at block 508. If value of the counter is less than N, then instructions at block 510 onwards are executed.

At block 510, a signal line corresponding to the value of the counter is tested and the output at the signal bus is checked. In one implementation, if the value at the output of the signal bus for a particular counter value is one, then the instructions at block 512 are executed; else the instructions at block 514 are executed.

At block 512, it is indicated that the signal line is perfect. In one implementation, one of health indicators 106, that may be in the form of a green LED, turn on if no fault is detected on any signal line 103 of the cable 102.

At block 514, it is checked whether the number of errors detected are more than the number of spare lines available in the multi-flex cable. In one implementation, the total number of errors that can be handled depends on the number of spare lines available in the cable 102. The logic circuitry 104 keeps a track of the number of errors on signal lines 103 encountered during the testing phase.

In case the number of errors is greater than the number of spare lines, then at block 516, the signal line may be declared faulty by, for example, turning on a red health indicator 106, as the cable cannot be completely re-configured in such a case for full continuity. If the number of errors is less than the number of spare lines available in the cable 102, then the instructions at block 518 are executed.

At block 518, it is indicated that at least one link in the multi-flex cable is broken or faulty. In one implementation, the health indicators 106 turn yellow indicating a fault in one or more signal lines 103 that can be rectified.

At block 520, a broken or faulty link, signal line, or microconductor, in the cable is reconfigured. In one implementation, a nearest spare line or link is determined for re-configuration of the faulty signal line in the cable 102. As soon as the spare link is found, an automatic connection is made by switching the signal path with using the switching circuitry 304.

Using a slap-shielding technique, a cable, in accordance with the present invention, with multiple conductors can be EMI shielded, resulting in a high-density interconnect that allows for high-speed data communications. A flat and flexible cable, in accordance with exemplary embodiments of the present invention, can smoothly conform to the satellite structure and transfer less mechanical stress, thus minimizing cable fatigue. Multi-functional multi-flex cables may significantly reduce system complexity and payload.

The multi-functional multi-flex high speed intelligent cable may have low production cost, can be reliable, and may be easy to fabricate and install. Implementing slap EMI shielding in multi-flex cable can eliminate complicated and expensive coating processes associated with fabricating conventional individually EMI-shielded cables, especially in micro-shielded cables. By using snap-in connectors, flat cables allow connectors to be installed without special skill or handling.

Built-in test capability contributes to the uniqueness of a cable in accordance with the present invention, among other cabling options. With integrated circuits and advanced software algorithms, a multi-functional cable, in accordance with exemplary embodiments of the present invention, can check all the conductors in the multi-flex cable for discontinuity or damage. Further, the cable can even reconfigure itself when activated by software or hardware, in accordance with embodiments of the present invention.

Although embodiments for a self-managing cable assembly have been described in language specific to structural features and/or methods, it is to be understood that the appended claims are not necessarily limited to the specific features or methods described. Rather, the specific features and methods are disclosed as exemplary implementations. While specific alternatives to steps of the invention have been described herein, additional alternatives not specifically disclosed but known in the art are intended to fall within the scope of the invention. Thus, it is understood that other applications of the present invention will be apparent to those skilled in the art upon reading the described embodiment and after consideration of the appended claims and drawings.

We claim:

1. A cable assembly for transmitting data from a first system to a second system, the cable assembly comprising:
   a ribbon cable having a plurality of signal lines, wherein the ribbon cable is slap shielded for protection against electromagnetic interference;
   one or more logic circuitries configured to:
      test the ribbon cable for a faulty or a broken signal line;
      re-configure the ribbon cable by initiating switching of the faulty or the broken signal line with a spare signal line; and
   a switching circuitry for switching the faulty or the broken signal line with the spare signal line.

2. The cable assembly of claim 1, wherein the signal lines comprise metallic conductors.

3. The cable of claim 2, wherein the conductors are embedded in an insulation layer made of Kapton polyimide.

4. The cable assembly of claim 1, wherein the cable assembly has a logic circuitry at each end of the ribbon cable.

5. The cable assembly of claim 4, wherein the logic circuitry is implemented by one or more complex programmable logic devices.

6. The cable assembly of claim 4, wherein the logic circuitry at one end is configured as a master node and the logic circuitry at the other end is configured as a slave node.

7. The cable assembly of claim 1, wherein the logic circuitries are located at a remote end and communicate with the ribbon cable via a wired or wireless mechanism.

8. The cable assembly of claim 1, wherein the logic circuitries are further configured to determine whether a number of faulty or broken signal lines is less than a number of spare lines.

9. The cable assembly of claim 1 further comprising a health indicator to indicate whether the ribbon cable is healthy, reparable or irreparable.

10. The cable assembly of claim 9, wherein the health indicator comprises light emitting diodes that provide different indications by different colors.

11. The cable assembly of claim 1, wherein the ribbon cable further comprises one or more layers of metal shield for protection against electromagnetic interference.

12. The cable assembly of claim 11, wherein the layers of metal shield are made of copper.

13. The cable assembly of claim 11, wherein an outer insulation layer of the cable is made of a polymeric insulating material of high resistivity.

14. A circuitry for testing and re-configuring a cable in a cable assembly, the circuitry comprising:
   a test switch for initiating a test on the cable;
   a logic circuitry configured to detect faulty signal lines in the cable;
   a switching circuitry configured to switch a faulty line with a spare line in the cable on the detection of the faulty signal lines by the logic circuitry; and
   one or more health indicators for indicating a health status of the cable based on the detection of the faulty signal lines by the logic circuitry.

15. The circuitry of claim 14, wherein the logic circuitry is configured as a slave node to execute instructions of a master node for the detection of the faulty signal lines in the cable.

16. The circuitry of claim 14, wherein the logic circuitry is configured as a master node to instruct a slave node for the detection of the faulty signal lines in the cable.

17. The circuitry of claim 14, wherein the health indicators are light emitting diodes that indicate different health status by different colors.

18. A method for testing and re-configuring a cable comprising:

determining a number of signal lines and a number of spare signal lines present in the cable;

identifying faulty signal lines by testing each signal line for an error;

comparing the number of spare lines with a number of faulty signal lines in the cable;

indicating a health status of the cable based on the comparison; and switching a faulty signal line with a spare line in the cable based on the comparison.

19. The method of claim 18, wherein the health status for the cable is provided to a user for subsequent configuration instructions.

20. The method of claim 18, wherein the health status of the cable is indicated to be irreparable if the number of errors is greater than the number of spare lines in the cable.

* * * * *